United States Patent
Kumahara et al.

(10) Patent No.: US 6,464,847 B1
(45) Date of Patent: Oct. 15, 2002

(54) SPUTTERING TARGET

(75) Inventors: Yoshikazu Kumahara, Ibaraki-ken (JP); Keiichi Ishizuka, Ibaraki-ken (JP)

(73) Assignee: Nikko Materials Company, Limited, Tokyo (JP)

( * ) Notice: Subject to any disclaimer, the term of this patent is extended or adjusted under 35 U.S.C. 154(b) by 0 days.

(21) Appl. No.: 09/763,248

(22) PCT Filed: May 1, 2000

(86) PCT No.: PCT/JP00/02865

§ 371 (c)(1),
(2), (4) Date: Feb. 20, 2001

(87) PCT Pub. No.: WO01/06029

PCT Pub. Date: Jan. 25, 2001

(30) Foreign Application Priority Data

Jul. 15, 1999 (JP) .......................................... 11-201360

(51) Int. Cl.$^7$ .............................................. C23C 14/34
(52) U.S. Cl. .............................. 204/298.12; 204/298.13
(58) Field of Search ........................ 204/298.12, 298.13

(56) References Cited

U.S. PATENT DOCUMENTS

| | | | |
|---|---|---|---|
| 4,662,124 A | 5/1987 | Kato et al. ................. | 51/283 R |
| 5,269,899 A | * 12/1993 | Fan ........................ | 204/298.09 |
| 5,997,704 A | * 12/1999 | Shiono et al. .......... | 204/298.12 |
| 6,074,279 A | 6/2000 | Yoshimura et al. ........... | 451/37 |

FOREIGN PATENT DOCUMENTS

| JP | 57-89551 | 6/1982 |
|---|---|---|
| JP | 10-298743 | * 11/1998 |

OTHER PUBLICATIONS

Fukui et al., "Warpage of InP Wafers", Conference Proceedings IEEE International Conference on Indium Phosphide and Related Materials, vol. 9, 1997 (month unknown), pp. 272–275.

* cited by examiner

Primary Examiner—Rodney G. McDonald
(74) Attorney, Agent, or Firm—Howson and Howson

(57) ABSTRACT

The present invention relates to a sputtering target characterized in that a part of the direction or the tangential direction of grinding the top surface or the both surfaces of the target is parallel to, or within an angle range of ±45 degrees to the warping direction of the target after bonding the target to the backing plate; and when the target is rectangular, the present invention relates to a sputtering target characterized in that the target is rectangular, and a part of the direction or the tangential direction of grinding the top surface or the both surfaces of the target is within a range of angles of the warping direction after bonding the target to the backing plate to the diagonal of the target. There is provided a sputtering target that can effectively decrease and prevent cracking due to difference in the coefficient of thermal expansion, and effectively decrease or prevent similar cracking during sputtering, especially in the manufacturing process of a ceramic target, that is in the process for bonding the target to the backing plate.

14 Claims, 3 Drawing Sheets

SPUTTERING TARGET

FIELD OF THE INVENTION

The present invention relates to a sputtering target that can decrease or prevent cracking of a target occurring during bonding of the target to a backing plate or during the use of the target.

BACKGROUND OF THE INVENTION

In recent years, sputtering is used for forming thin films of semiconductor devices and various electronic apparatuses, and sputtering of higher speed is frequently used for improving productivities.

As is well known, sputtering described above is a method for forming thin films by radiating charged particles onto a target, driving out particles from the target by impact force of the charged particles, and depositing a thin film mainly comprising a substance composed of target material on a substrate such as a wafer facing the target.

Since the target receives a large quantity of impact of charged particles during sputtering, the temperature of the target gradually increases and accumulates. Therefore, the target must be cooled. In many cases, the heat of the target is absorbed by bonding a material of high thermal conductivity (backing plate) such as pure copper and copper alloys on the back of the target by means of brazing, diffusion bonding, pressing, or bonding that utilizes an anchoring effect, and cooling the backing plate through an external cooling means.

As described above, when the target is bonded to the backing plate, the target must be heated to a temperature suitable for various bonding methods, and after bonding, it is cooled. An effect of heat from heating and cooling processes in bonding causes a problem of warping or cracking due to a difference in thermal expansion between the target and the backing plate.

Since a cracked target is defective, it must be replaced with a target without cracking. At this time, the target formed by combining a plurality of pieces has possibility to cause the piece without cracking to be cracked, lowering productivity significantly.

Even if the a target is bonded to a backing plate satisfactorily, since the assembly is heated also during sputtering, the target may be cracked by thermal stress.

In such a case, a large number of particles are produced when the target is cracked, and serious problems may be caused in that the film becomes defective, sputtering cannot be continued due to the damage of the target, or the sputtering apparatus is seriously damaged.

When the type of the target material is considered, since a ceramic target is brittle, has a small coefficient of thermal expansion, and has a large difference in the coefficient of thermal expansion from that of the material of the backing plate such as pure copper or copper alloys, warping or cracking occurs easier than metal targets such as Al and Ti.

In order to solve such problems, the use of a low-melting-point solder has been proposed for bonding so that the target and the backing plate are not exposed to high temperature. In this case, however, the bonding force is weak, and when the target is heated to a high temperature during sputtering, there is the problem that the solder for bonding is melted, and this problem has not been solved.

Also, in order to relieve the thermal expansion of the target and the backing plate, the formation of a plurality of bonded layers with stepwise different thermal expansion has been proposed (Japanese Patent Laid-Open No. 61-250167). However, such means is not practical because it complicates an operation process and increases manufacturing costs.

Furthermore, a method for correcting a warped target by applying mechanical force in the reverse direction in a process for bonding the target and the backing plate, or a method for applying reverse warping to the target before bonding estimating the amount of warping has been proposed (Japanese Patent No. 2573653).

However, since mechanical stress more than material strength is applied to the brittle material such as a ceramic, in particular, in a process of mechanical correction or deformation, cracking may occur, and these cannot be said to be effective means.

SUMMARY OF THE INVENTION

The inventors of the present invention found a unique phenomenon in the manufacturing process that there is a direction in which cracking due to a warp of the target occurs easily in a target, especially in a ceramic target. The inventors made effort to provide a sputtering target that can effectively decrease or prevent cracking of the target during bonding the target to the backing plate or during sputtering process.

The present invention pays attention to the ordinary process for grinding or polishing the target, and prevents or decrease cracking of the target by improving the operations. According to the present invention there are provided: (1) a sputtering target characterized in that a part of a direction or a tangential direction of grinding a top surface or both surfaces of the target is parallel to, or within an angle range of ±45 degrees to a warping direction of the target after bonding the target to a backing plate; (2) a sputtering target characterized in that the target is rectangular, and a part of a direction or a tangential direction of grinding a top surface or both surfaces of the target is within a range of angles formed by a warping direction after bonding the target to a backing plate and a diagonal of the target; (3) a sputtering target characterized in that the target is rectangular, and a part of a direction or a tangential direction of grinding a top surface or a both surfaces of the target is within a range of angles formed by a lengthwise direction and a diagonal of the target; (4) the sputtering target according to any of (1) to (3), characterized in that a final surface after grinding is a surface improved by fine grinding or polishing, or acid washing or heat treatment; (5) the sputtering target according to any of (1) to (4), characterized in that the surface roughness Ra is 5 $\mu$m or less; (6) the sputtering target according to any of (1) to (5), characterized in that the surface roughness Ra is 2 $\mu$m or less; and (7) the sputtering target according to any of (1) to (6), characterized in that the target is made of a ceramic.

DETAILED DESCRIPTION OF THE PREFERRED EMBODIMENTS

Normally, a ceramic target has a small thermal expansion coefficient, which is much lower than that of a backing plate made of copper or the like. Therefore, warping or cracking occurs more frequently compared with metal-based targets.

In particular, it is known that cracking is affected by a defect of the surface.

The surface grinding process is performed in a manufacturing of a target. In that process, the inventors of the present invention found a unique phenomenon that occurrence of cracking of the target in a direction perpendicular to the grinding direction is less frequent and is more frequent in parallel to the grinding direction.

In general, especially in ceramic targets, a defective surface often causes cracking as described above, mirror surface or nearly mirror surface finishing is normally performed. However, such finishing consumes a long time and increases manufacturing costs.

There have been no findings about relationship between a direction of grinding and that of cracking of targets, and location of targets in the bonding process has not been considered particularly.

The present invention decreases or prevents cracking of the target easily and effectively during the bonding process, as well as during the sputtering operation.

Since the productivity for the targets is thereby improved, the yield of products is elevated, and cracking is minimized, the present invention has the effect of improving the yield of products such as electronic apparatuses by decreasing defects and troubles in the sputtering process for forming sputtered films.

In order to prevent or decrease cracking of a target, a top surface or both surfaces of the target must be a ground surface which have a ground direction in parallel or approximately in parallel to the warping direction of the target.

Thus, the ground direction not only exactly in parallel but also approximately in parallel to the warping direction of the target has the effect of preventing or decreasing cracking or warping of the target. As the matter of course, the mixed ground directions in parallel and approximately in parallel to the warping direction of the target also have the same effect.

Especially in rectangular ceramic targets, although cracking in the transverse direction occurs easily due to warping in the lengthwise direction, cracking in the transverse direction can be prevented or decreased effectively by grinding the target in parallel to the warping direction of the target.

Figure 1:
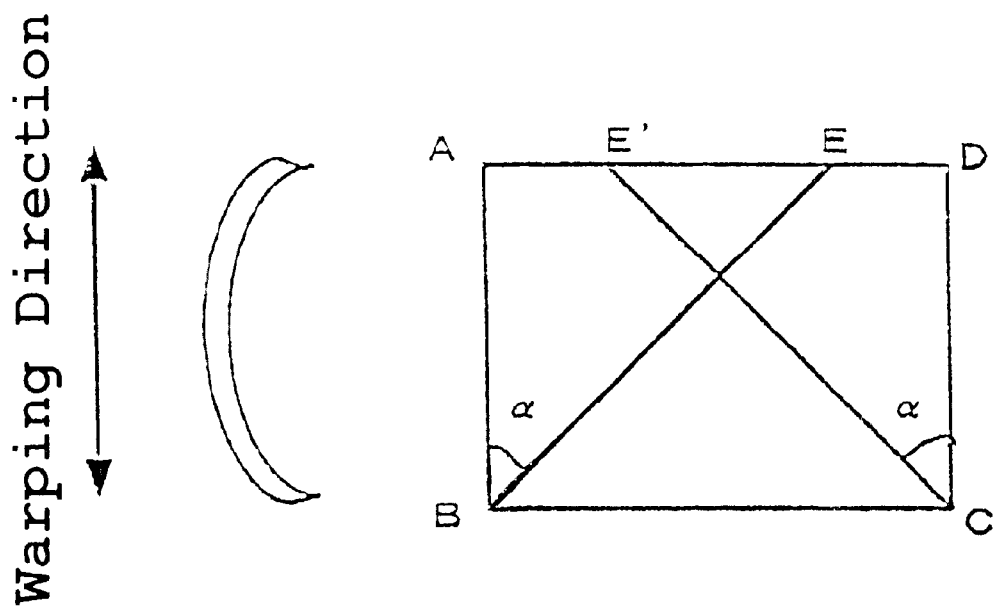
FIG. 1 is a diagram illustrating a relationship between a warping direction and a grinding direction in the present invention.

An example showing the relationship between warping and grinding directions of a target bonded to a backing plate is shown in FIG. 1 (top and side view). The arrow indicates the warping direction of the target. Although a rectangular target ABCD is shown here, the target may not be necessarily rectangular.

If a part of the direction or the tangential direction of grinding of the top surface or both surfaces of the target is in the warping direction, or in an angle a within an angle range of ±45 degrees to the warping direction of the target ABCD, the cracking of the target can be decreased or prevented effectively.

In this example, the target ABCD is rectangular, the warping direction is parallel with AB and CD, and the angle between the warping direction and grinding direction or direction tangential to grinding, ∠ABE or ∠DCE', is 45 degrees or less.

Figure 2:
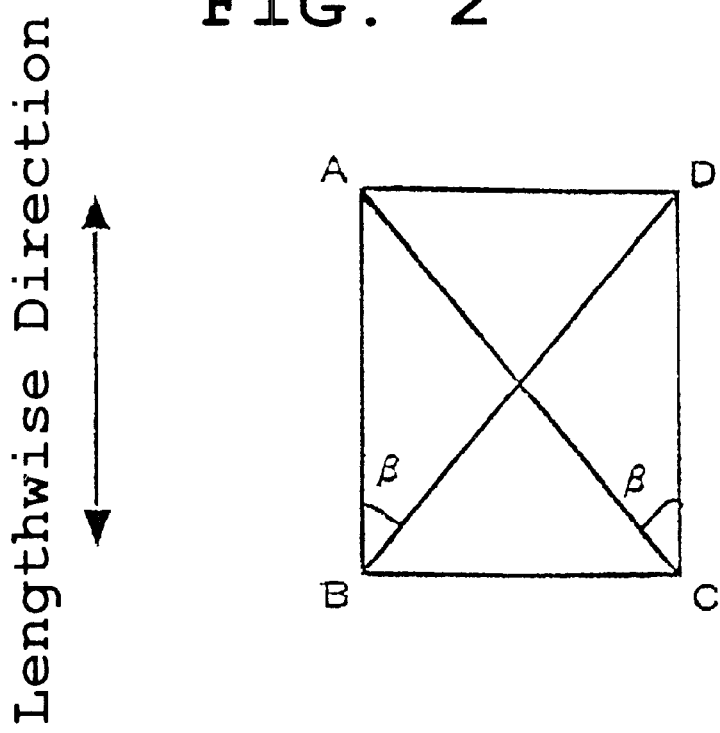
FIG. 2 is a diagram illustrating a relationship between a lengthwise direction and a grinding direction of a rectangular target of the present invention.

FIG. 2 shows an example of the relationship between grinding direction and lengthwise direction of a rectangular target. The arrow indicates the lengthwise direction of the target. If a part of the direction or the tangential direction of grinding of the top surface or both surfaces of the target is in AB or CD direction, i.e. the lengthwise direction of the rectangular target ABCD, or within the angle β between AB and BC, or the angle β between CD and AD, the effect of decreasing or preventing target cracking can be obtained.

Since a ceramic target is brittle and has a small thermal expansion coefficient compared with that of the material of the backing plate such as pure copper or copper alloys, warping or cracking of the target occurs frequently during bonding process or during sputtering process. The prevention of occurrence of cracking in ceramic targets is extremely advantageous.

Figure 3:
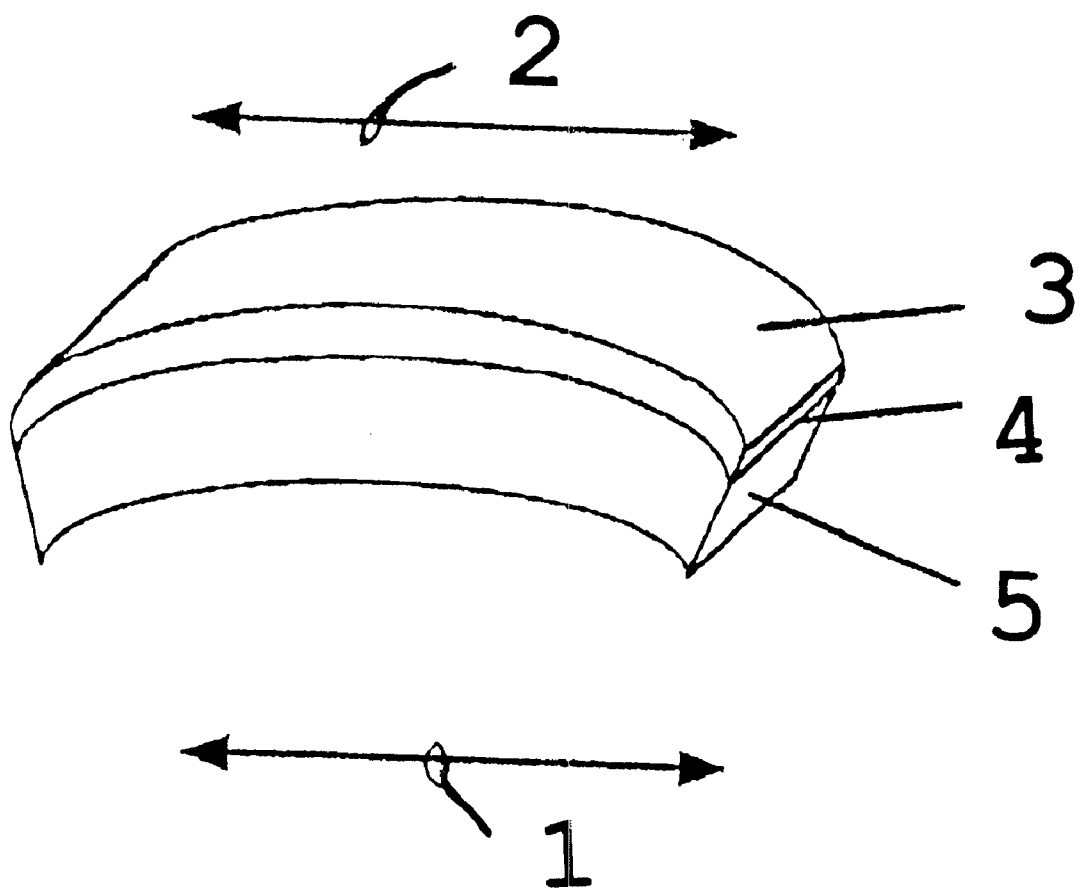
FIG. 3 is a diagram illustrating a warping direction and a grinding direction of a target bonded to a backing plate.

FIG. 3 shows an example that adopts a grinding direction 2 in parallel to the warping direction 1 of the target. For the ease of understanding, the amount of warping is exaggerated in FIG. 3.

In FIG. 3, the symbol 1 represents warping direction, 2 represents grinding direction, 3 indicates a ceramic target, 4 indicates a bonding layer, and 5 indicates a backing plate.

Since the heat during bonding or sputtering affects the entire target, it is preferable to grind both top and bottom surfaces for making warping evenly or preventing cracking; however, grinding of only the top surface is also effective.

This is because ceramics are sufficiently strong against tensile stress compared with against compressive stress, and comprehensive stress is generated on the bottom surface of the target when deformation occurs as FIG. 3. Moreover, the bottom surface has higher strength than the top surface because the anchoring effect of the bonding material reinforces the bottom surface. The present invention includes ground top surface and both ground surfaces of the target.

As described above, in the relationship between warping and grinding directions when a target is bonded to a backing plate, if a part of a direction or a tangential direction of grinding of the top surface or both surfaces of the target is in the warping direction, or within an angle range of ±45 degrees to the warping direction of the target, the effect of decreasing or preventing target cracking can be obtained.

When the target is rectangular, it is preferable that a part of the direction or the tangential direction of grinding of the top surface or both surfaces of the target is a direction of an angle β between the warping direction and the diagonal of the rectangular target; and a part of the direction or the tangential direction of grinding of the top surface or both surfaces of the target is a lengthwise direction or a direction of the angle β between the lengthwise direction and the diagonal. As described above, it is preferable to place the target taking the direction of deformation into consideration.

When grinding is repeated, warping or cracking is affected by the surface undergone the final rough grinding. The relationship between cracking and the grinding direction continues unless the damaged layer is removed by later fine grinding or polishing. Similarly, even when some surface improvement is performed after grinding, since the mechanical strength is significantly affected by the status of the final ground surface unless the damaged layer is removed.

Furthermore, effective surface roughness Ra of the ground surface is 5 μm or less, preferably 2 μm or less. If surface roughness Ra of the ground surface exceeds 5 μm, the rough place may become the start point of cracking.

Thus, in the case of rough grinding, since the strength differs to a large extent depending on a direction of processing, roughness should be decreased or the damaged layer should be removed for minimizing direction dependence. However, a mirror surface increases manufacturing costs.

EXAMPLES AND COMPARATIVE EXAMPLES

The present invention will be described below referring to Examples and Comparative Examples. These are only examples, and the present invention is not limited to these examples. All the other aspects, modifications, or examples that are included in the spirit of the present invention are also included in the present invention.

Examples 1, 2, Comparative Examples 1, 2, and Reference Example 1

Figure 4A:
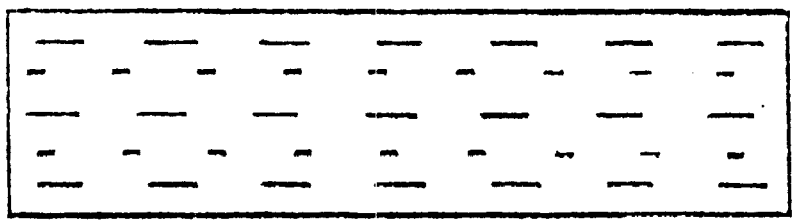
FIGS. 4(A)–4(C) are schematic diagrams illustrating test targets of Example, Comparative Example, and Reference Example, respectively.
Figure 4B:
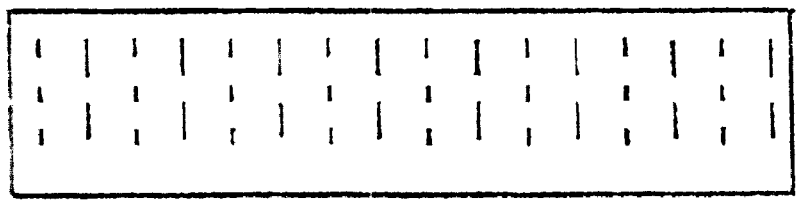
Figure 4C:

Three examples of rectangular targets (sintered bodies), i.e. a target ground in parallel to the lengthwise direction of the target (a), a target ground in the transverse direction (b), and a target in which Ra is 0.1 µm or less and the grinding direction cannot be specified (for example, a mirror surface finishing) (c) are shown in FIG. 4. (a) is Example of the present invention, (b) and (c) are Comparative Example and Reference Example, respectively.

The grinding condition of the surface, the surface roughness Ra and the mean strength with its standard deviation for each Example is listed in Table 1. The strength was measured by the breaking test in according to the three-point bending method described in JIS R1601. The strength of the target against cracking was evaluated by the stress when the sample breaks.

The condition for the breaking test of the target (sintered body) are as follows:

Target materials: ITO ($In_2O_3$–10 wt. % $SnO_2$)
Target density: 7.12 g/cm$^3$
Grinding stone: #4000, #400, and #80 diamond-fixed grinding stones
Distance between fulcrums: 90 mm
Sample thickness: 6 mm
Sample width: 20 mm
Bending speed: 0.5 mm/min The results are shown in Table 1. Example 1 with surface ground with #400 grinding stone in the lengthwise direction is 0.2988 µm of surface roughness and is 12.38 kgf/mm$^2$ of mean strength.

On the other hand, Comparative Example 1 with surface ground with #400 grinding stone in the transverse direction is 11.09 kgf/mm$^2$ of mean strength.

Comparing the result of Example 1 with that of Comparative Example 1, the strength of the target is increased in Example 1.

The results of Comparative Example 2 with surface ground with #80 grinding stone in the transverse direction are 2.1170 µm of surface roughness and 6.55 kgf/mm$^2$ of mean strength, which shows a low mechanical strength.

As seen in the result of Example 2 with surface ground with #80 grinding stone in the lengthwise is 11.02 kgf/mm$^2$ of mean strength and is 1.1910 µm of surface roughness, which also shows a significant improvement in strength in the case of #80 grind stone.

The result of Reference Example with mirror-finished surface is 0.0070 µm of surface roughness and is 11.07 kgf/mm$^2$ of mean strength, although the strength is sufficient for practical use, which does not show a significant improvement in strength. The processing cost of mirror-finished surface is, therefore, disadvantageous.

TABLE 1

| | Grinding direction of sample surface | Ra (µm) | Mean strength (kg/mm$^2$) | Standard deviation |
|---|---|---|---|---|
| Reference Example 1 | Mirror surface | 0.0070 | 11.07 | 0.99 |
| Example 1 | #400, lengthwise direction | 0.2988 | 12.38 | 0.85 |
| Example 2 | #80, lengthwise direction | 1.1910 | 11.02 | 1.79 |
| Comparative Example 1 | #400, transverse direction | 0.3015 | 11.09 | 0.71 |
| Comparative Example 2 | #80, transverse direction | 2.1170 | 6.55 | 0.39 |

Next, the result of the breaking test for the target (sintered body) bonded to the backing plate are described.

The grinding condition of the surface, the surface roughness Ra and the mean strength with its standard deviation for each Example is listed in Table 2. The strength was measured by the breaking test in according to the three-point bending method described in JIS R1601. The strength of the target against cracking was evaluated by the stress when the sample breaks.

The conditions for the breaking test of the target (sintered body bonded to the backing plate) are as follows:

Target materials: ITO ($In_2O_3$–10 wt. % $SnO_2$)
Target density: 7.12 g/cm$^3$
Grinding stone: #4000, #400, and #80 diamond-fixed grinding stones
Backing plate material: Oxygen free copper
Bonding material: Indium
Distance between fulcrums: 90 mm
Sintered body thickness: 6 mm
Bonding thickness: 0.1 mm
Sample total thickness: 15 mm
Sample width: 20 mm
Bending speed: 0.5 mm/min The results are shown in Table 2.

Example 3 with surface ground with #400 grinding stone in the lengthwise direction is 0.2130 µm of surface roughness and is 11.47 kgf/mm$^2$ of mean strength.

On the other hand, Comparative Example 3 with surface ground with #400 grinding stone in the transverse direction is 10.20 kgf/mm$^2$ of mean strength.

Comparing the result of Example 3 with that of Comparative Example 3, the strength of the target is increased in Example 3.

The result of Comparative Example 4 with surface ground with #80 grinding stone in the transverse direction are 2.9150 µm of surface roughness and 5.76 kgf/mm$^2$ of mean strength, which shows a law mechanical strength.

As seen in the result of Example 4 with surface ground with #80 grinding stone in the lengthwise is 9.77 kgf/mm$^2$ of mean strength and is 1.1800µm of surface roughness, which also shows a significant improvement in strength in the case of #80 grind stone.

The result of Reference Example with mirror finished surface is 0.0090 µm of surface roughness and is 10.18 kgf/mm$^2$ of mean strength, although the strength is sufficient for practical use, which does not show a significant improvement in strength. The processing cost of mirror-finished surface is, therefore, disadvantageous.

TABLE 2

| | Grinding direction of sample surface | Ra (μm) | Mean strength (kg/mm$^2$) | Standard deviation |
|---|---|---|---|---|
| Reference Example 2 | Mirror surface | 0.0090 | 10.18 | 0.40 |
| Example 3 | #400, lengthwise direction | 0.2130 | 11.47 | 0.35 |
| Example 4 | #80, lengthwise direction | 1.1800 | 9.77 | 0.55 |
| Comparative Example 3 | #400, transverse direction | 0.3835 | 10.20 | 0.42 |
| Comparative Example 4 | #80, transverse direction | 2.9150 | 5.76 | 0.18 |

As described above, it is clarified that a rough surface of a target lowers the strength against cracking, and that the grinding in the transverse direction reduces the strength significantly.

Thus, it is confirmed that the strength against cracking can be increased significantly by grinding the target surface in the lengthwise direction or in the warping direction. The similar effect was found in the target with the surface ground in the diagonal direction. And it is also confirmed that the grinding both surfaces is as effective as the grinding one surface of the target.

The cracking of the target during bonding to a backing plate or during sputtering process can be effectively decreased or prevented by grinding the target surface in the following way. A part of the direction or a tangential direction of grinding must be parallel to or within a specified angle to a lengthwise or warping direction of the target, the roughness Ra of the ground surface must be adjusted adequately, and the top surface or both surfaces must be grounded.

What is claimed is:

1. A sputtering target comprising a body having rectangular top and bottom surfaces, said bottom surface being bonded to a backing plate and said body being warped in a defined warping direction, and at least said top surface being a ground surface ground in only a defined grinding direction which extends within a range of angles from parallel to said warping direction to a diagonal of said rectangular top surface.

2. A sputtering target according to claim 1, wherein said ground surface has a surface roughness and is subjected to a treatment selected from the group consisting of fine grinding, polishing, acid washing, and heat treatment so that said surface roughness is reduced.

3. A sputtering target according to claim 1, wherein said ground surface has a surface roughness (Ra) of 5 μm or less.

4. A sputtering target according to claim 3 wherein said ground surface has a surface roughness (Ra) of 2 m or less.

5. A sputtering target according to claim 4, wherein said body is made of ceramic.

6. A sputtering target according to claim 1, wherein said body is made of ceramic.

7. A sputtering target according to claim 1, wherein both said rectangular top and bottom surfaces are a ground surface ground in only a defined grinding direction which extends within a range of angles from parallel to said warping direction to diagonal of said rectangular top and bottom surfaces.

8. A sputtering target comprising a body having rectangular top and bottom surfaces, at least said top surface being a ground surface ground in only a defined grinding direction which extends within a range of angles from parallel to a lengthwise direction of said rectangular top surface to a diagonal of said rectangular top surface.

9. A sputtering target according to claim 8, wherein said ground surface has a surface roughness (Ra) and is subjected to a treatment selected from the group consisting of fine grinding, polishing, acid washing, and heat treatment so that said surface roughness (Ra) is reduced.

10. A sputtering target according to claim 8 wherein said ground surface has a surface roughness (Ra) of 5 μm or less.

11. A sputtering target according to claim 10, wherein said ground surface has a surface roughness (Ra) of 2 μm or less.

12. A sputtering target according to claim 11, wherein said body is made of ceramic.

13. A sputtering target according to claim 8, wherein said body is made of ceramic.

14. A sputtering target according to claim 8, wherein both said rectangular top and bottom surfaces are a ground surface ground in only a defined grinding direction which extends within a range of angles from parallel to a lengthwise direction of said rectangular top surface to a diagonal of said rectangular top and bottom surfaces.

* * * * *